United States Patent [19]

Hamilton et al.

[11] Patent Number: 5,646,519
[45] Date of Patent: Jul. 8, 1997

[54] DIGITAL PHASE DETECTOR EMPLOYING A DIGITALLY CONTROLLABLE DELAY LINE

[75] Inventors: Michael M. Hamilton, San Jose; Morley M. Merriss, Montera; George P. Zampetti, Livermore, all of Calif.

[73] Assignee: Symmetricom, Inc., San Jose, Calif.

[21] Appl. No.: 472,214

[22] Filed: Jun. 7, 1995

[51] Int. Cl.$^6$ .................................................. H03K 17/28
[52] U.S. Cl. ........................... 324/76.82; 324/76.79; 324/76.77; 327/158; 327/161
[58] Field of Search .......................... 327/158, 161; 324/76.79, 76.77, 76.82

[56] References Cited

U.S. PATENT DOCUMENTS

| | | |
|---|---|---|
| 3,714,589 | 1/1973 | Lewis . |
| 4,166,249 | 8/1979 | Lynch . |
| 4,358,741 | 11/1982 | Nardin . |
| 4,495,468 | 1/1985 | Richards ................... 327/158 |
| 4,617,679 | 10/1986 | Brooks . |
| 4,795,985 | 1/1989 | Gailbreath, Jr. . |
| 4,873,491 | 10/1989 | Wilkins . |
| 5,109,394 | 4/1992 | Hjerpe et al. . |
| 5,173,617 | 12/1992 | Alsup ...................... 327/158 |
| 5,355,037 | 10/1994 | Andresen ................. 327/158 |
| 5,369,404 | 11/1994 | Galton . |
| 5,373,255 | 12/1994 | Bray et al. . |
| 5,463,337 | 10/1995 | Leonowich ............... 327/158 |

FOREIGN PATENT DOCUMENTS

0 575 691 A2  12/1993  European Pat. Off. .
0 615 360A2   9/1994   European Pat. Off. .

*Primary Examiner*—Kenneth A. Wieder
*Assistant Examiner*—Jose M. Solis
*Attorney, Agent, or Firm*—Loeb & Loeb LLP

[57] ABSTRACT

A digital phase detector composed of: a digitally controllable signal delay device having a signal input, a signal output and a control input, the delay device being operative for conducting a signal from the signal input to the signal output with a time delay having a duration determined by a control signal supplied to the control input, the signal input being connected to receive either an input signal or a digital local clock signal; a phase relation detector connected to receive a first input signal from the signal output of the signal delay device and a second input signal constituted by the one of the input signal and the digital local clock signal which is not received by the signal input of the signal delay device, for periodically comparing the phases of the first and second input signals and for producing a binary output signal composed of a succession of signal segments, each segment having a first value when the first input signal is leading the second input signal in phase and a second value when the first input signal is lagging the second input signal in phase; and a digital modulator connected for receiving the binary output signal from the phase relation detector and producing a digital output representative of the magnitude of the phase difference between the input signal and the digital local clock signal based on the values of successive signal segments of the binary output signal produced by the phase relation detector.

6 Claims, 6 Drawing Sheets

Delta Phase Modulator

Step Size Adaptation

Digital Phase Detector

Calibrator

Successive Phase Approximation

DIGITAL PHASE DETECTOR EMPLOYING A DIGITALLY CONTROLLABLE DELAY LINE

BACKGROUND OF THE INVENTION

1. Field of the Invention

The present invention relates to the field of frequency stability measurement, and particularly to a method and apparatus for performing relative time interval error measurements for a multiplicity of inputs under microprocessor control.

2. Description of the Prior Art

Many microprocessor-based systems produce, during operation, a plurality of periodic signals, such as clock signals, which all have the same frequency but differ in phase from one another at different points in the system. In order for the system to operate properly, it is necessary to derive information about the difference in phase between one or more pairs of these periodic signals.

A number of techniques for directly measuring the stability of frequency sources and for deriving related numerical values for further processing have already been proposed and are in use. For example, methods are disclosed in: D. A. Howe, D. W. Allen and J. A. Barnes, "Properties of Signal Sources and Measurement Methods", National Institute of Standards and Technology Technical Note 1337, *Characterization of Clocks and Oscillators*, Washington, D.C., 1990, U.S. Government Printing Office, pp. TN-14 to TN-47. These methods include a beat frequency method, a dual mixer time difference method, a tight phase-lock loop method and a time difference method. All of these methods have the common characteristic that they utilize a conditioning circuit followed by a frequency counter or a time interval counter. The conditioning circuit serves to magnify phase differences between two periodic signals which are being compared and to square the edges of the periodic signals before delivery to the counter.

Frequency counters and time interval counters are similar devices. A time interval counter consists of a digital counter whose clock is driven by a free-running oscillator, together with a logic unit which begins counting in response to a signal state change at one input and halts counting in response to a signal change on another input. A frequency counter contains logic to start and stop counting in response to state changes in a signal applied to a single input. The resolution of each type of counter is limited to the period of the free-running clock, unless other conditioning takes place before inputs are supplied to the counter. Free-running clocks are usually limited to a frequency of several tens of megahertz for ease of implementation, although for dedicated equipment with special frequency multiplication circuitry, the free-running clock can run at a frequency close to 100 megahertz. Such dedicated equipment is described, for example, in Stanford Research Systems, Inc. Model SR620 Universal Time Interval Counter Operating Manual and Programming Reference, Revision 2.0, 1989, pp. 81–91. This limits the single-shot resolution of practical time interval counters used with a micro-processor in embedded frequency control applications to a few tens of nanoseconds, which is two coarse a resolution for precision frequency and time interval measurement.

The conditioning circuits employed for systems operating according to the beat frequency, dual mixer time difference and tight phase lock loop methods consist of analog filters, voltage-controlled oscillators and low-noise mixers. These circuits typically consist of a large number of discrete components, some of which are relatively expensive and bulky, and require several different power supply voltages. For systems operating according to the time difference method, the clock frequency is divided to very low frequency levels before presentation to the counter. This can create cycle ambiguity and significant dead time between measurements. These factors make it difficult to create a compact circuit which measures the relative time interval error of many different input signals with a high degree of precision.

SUMMARY OF THE INVENTION

It is an object of the present invention to provide a microprocessor-based system for deriving digital representations of phase differences between periodic signals with high resolution levels extending to sub-nanosecond single-shot values.

Another object of the invention is to provide such a system which requires a small number of individual devices that all operate from a single power supply.

The above and other objects are achieved, according to the present invention, by provision of a digital phase detector comprising:

input means providing an input signal in the form of a periodic digital signal having a repetition rate;

a source of a digital local clock signal having the same nominal repetition rate as the input signal;

digitally controllable signal delay means having a signal input, a signal output and a control input, the delay means being operative for conducting a signal present at the signal input to the signal output with a time delay having a duration determined by a control signal supplied to the control input, the signal input being connected to receive one of the input signal and the digital local clock signal;

a phase relation detector connected to receive a first input signal from the signal output of the signal delay means and a second input signal constituted by the one of the input signal and the digital local clock signal which is not received by the signal input of the signal delay means, for periodically comparing the phases of the first and second input signals and for producing a binary output signal composed of a succession of signal segments, each segment having a first value when the first input signal is leading the second input signal in phase and a second value when the first input signal is lagging the second input signal in phase; and digital modulator means having an input connected to the phase relation detector for receiving the binary output signal from the phase relation detector and producing a digital output representative of the magnitude of the phase difference between the input signal and the digital local clock signal based on the values of successive signal segments of the binary output signal produced by the phase relation detector.

A system according to the invention can be implemented by appropriate programming of a suitable computer. However, systems according to the invention will be described below in the context of dedicated devices having individual function components. This will facilitate understanding of the nature of the invention.

DESCRIPTION OF THE PREFERRED EMBODIMENTS

Figure 1:
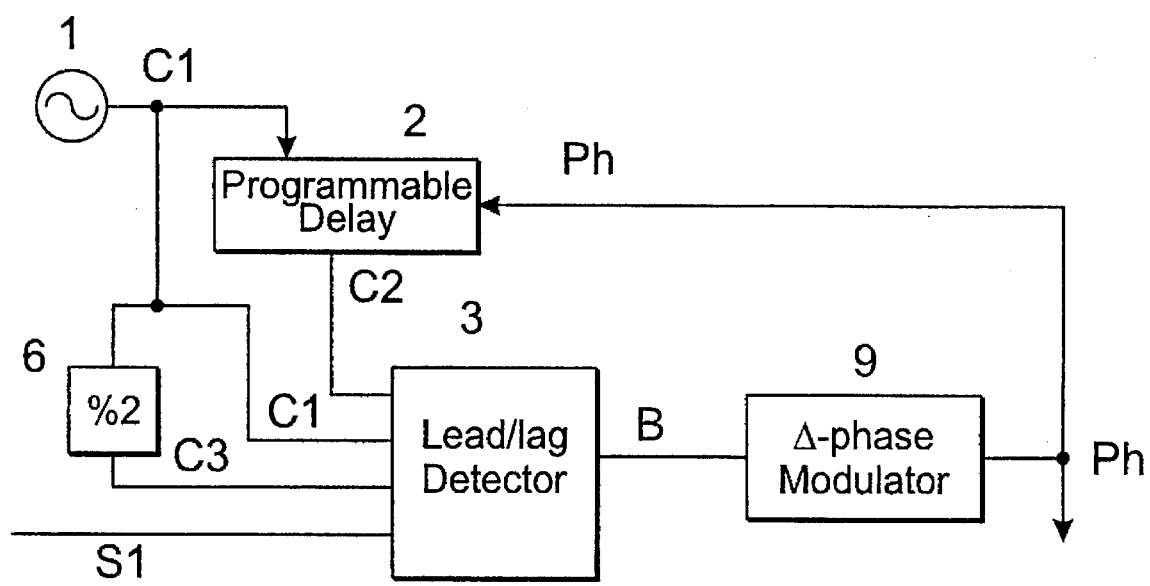
FIG. 1 is a block diagram of an embodiment of a basic digital phase detector according to the invention.

A digital phase detector, or measurement, system according to a basic exemplary embodiment of the invention is shown in FIG. 1.

The illustrated system includes a local oscillator 1 which produces a stable digital clock signal C1. Clock signal C1 is inputted to a digitally adjustable, or programmable, delay device, or block, 2 and a clock pulse rate divider 6. Delay device 2 delays signal C1 to produce a first delayed clock signal C2, while divider 6 divides the frequency of pulse C1 by two to produce a clock pulse C3.

The signals C1, C2 and C3 are delivered to a lead/lag detector 3 along with a digital signal S1 having the same nominal frequency as C1 but whose phase relative to C1 is unknown.

Lead/lag detector 3, which will be described in greater detail below, compares the phase relation between signals S1 and C2 and outputs a signal B, which is a binary signal composed of a succession of signal segments. The phase relation between signals S1 and C2 is compared periodically, at the repetition frequency of signal C3, and each segment of signal B has a value depending on whether C2 is leading or lagging in phase relative to S1. In the embodiment disclosed herein, the binary value of a segment of signal B is high, or "1", if C2 was leading S1 during the preceding sampling interval and low, or "0", if C2 was lagging S1 during the preceding sampling interval.

The signal B is delivered to the signal input of a first delta phase modulator 9. Delta phase modulator 9 produces an output signal Ph which is a multi-bit digital signal representing an estimate of the current phase of digital signal S1 relative to delayed clock signal C2. An embodiment of delta phase modulator 9 will be described below.

The output of delta phase modulator 9 is connected to deliver output signal Ph to a control input of programmable delay device 2, which signal controls the magnitude of the delay to be produced by delay device 2 in order to eliminate, or reduce, the phase difference between signals S1 and C2. Stated in other terms, delay device 2 is programmed by signal Ph to produce a delay equal to, or approaching, the phase difference between S1 and C1.

Figure 2:
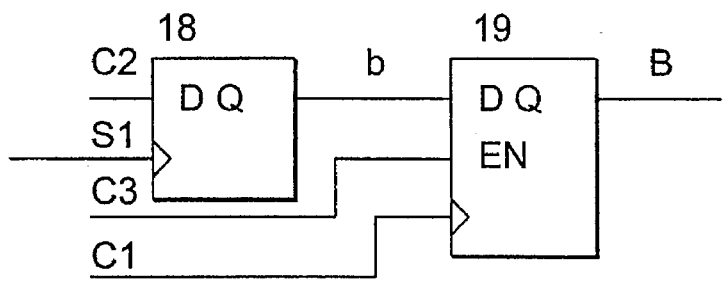
FIG. 2 is a block diagram of an embodiment of a lead/lag detector employed in the embodiment of FIG. 1.
Figure 3:
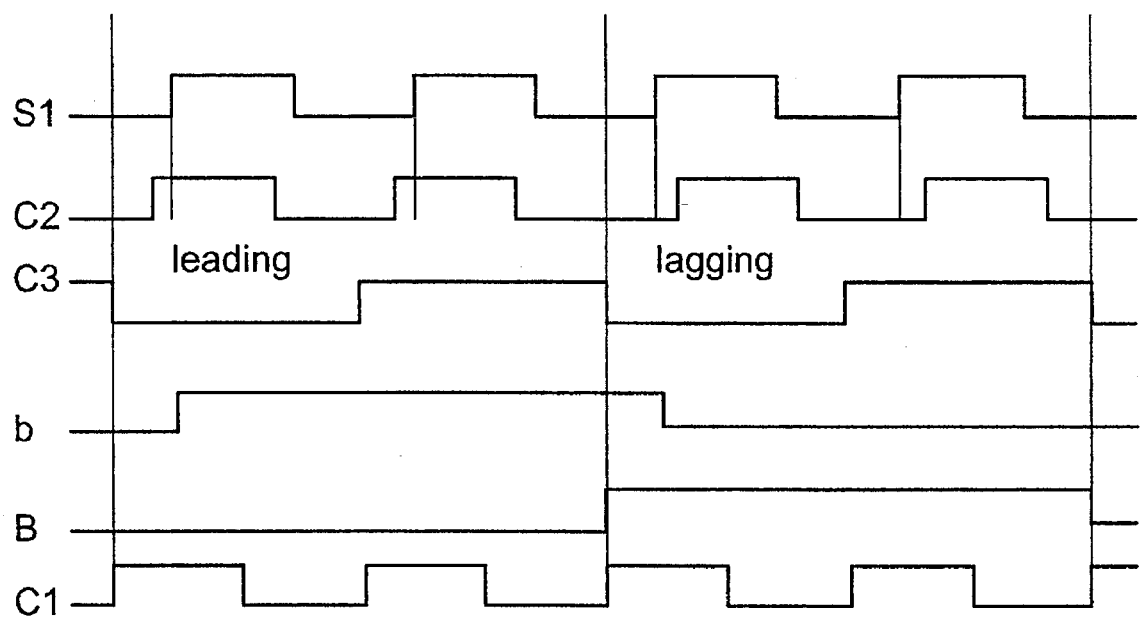
FIG. 3 is a timing diagram showing typical signal waveforms present in the circuit of FIG. 2.

One suitable embodiment of lead/lag detector 3 is shown in FIG. 2 and a set of exemplary waveforms for the signals into, within, and out of detector 3 is shown in FIG. 3. The illustrated embodiment of detector 3 is composed of a first D flip-flop 18 which performs a phase comparison and quantizes the result, and a second D flip-flop 19 that is provided with an enable input EN. Flip-flop 19 provides a fixed sampling phase. The operation of detector 3 is illustrated by the waveforms of FIG. 3. Flip-flop 18 provides, at its Q output, a presample signal b, representative of the polarity of the phase relation between the signals S1 and C2. If C2 is leading S1, signal b is set high; if C2 is lagging S1, signal b is set low. Signal b is supplied to the D input of flip-flop 19 and the value of signal b is transferred to the Q output of flip-flop 19, as signal B, in response to each second leading edge of C1 that occurs when signal C3 is high or when signal C3 is undergoing a high-low transition. Thus, changes in the signal B are synchronized with C1 at the frequency of signal C3. Thus, each transfer of signal b from the D input to the Q output of flip-flop 19 occurs after two pulses of signal S1. This helps to ensure reception of a valid sample during each sampling period regardless of the phase relationship of signal S1 to signal C1.

Figure 4:
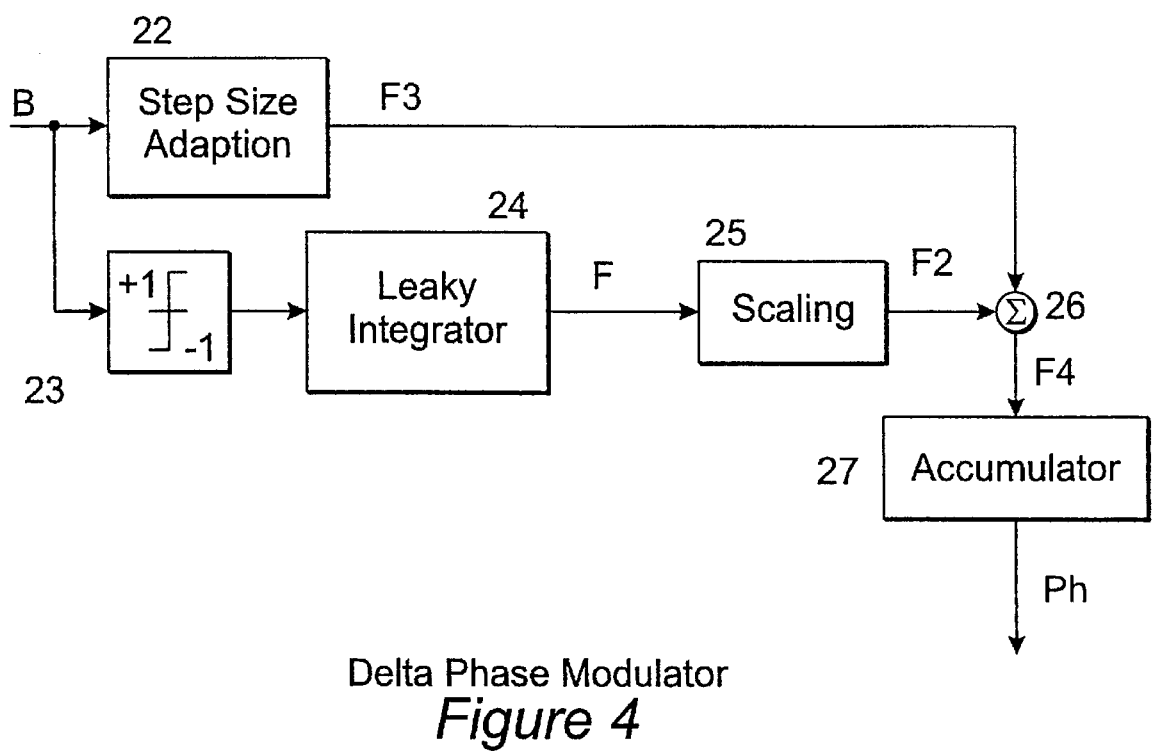
FIG. 4 is a block diagram of a delta phase modulator employed in the detector of FIG. 1.

A preferred embodiment of delta phase modulator 9 is shown in FIG. 4. This embodiment includes a step size adaptation block 22 and a quantizer, or slicer, 23, each of which has an input connected to receive signal B.

Step size adaptation block 22 receives successive segments of signal B and, based on the currently received segments and a plurality of previously received segments, generates a multi-bit digital signal having a value determined by the relation between the values of the currently received segment of signal B and the values of a plurality of previously received segments of signal B. The operation performed in step size adaptation block 22 will be described in greater detail below.

Quantizer 23 produces a signal having a value of +1 in response to each segment of signal B having a high value, and a signal having a value of −1 in response to each segment of signal B having a low value.

Successive quantized values produced by quantizer 23 are supplied to the input of a leaky integrator 24 which integrates successive signal elements from quantizer 23 to produce an integrated output signal F. Within leaky integrator 24, the current value of signal F is scaled and the scaled value is added to the signal currently being outputted by quantizer 23. The resulting sum is hard limited to some saturation constant and the hard limited total becomes the new value of signal F.

Integrator 24 is a leaky integrator, meaning that even if the input has more 1 s than −1 s, the output will still approach 0 after some time. Since the integrator is implemented in a discrete time system, the output will be a function of time as follows. If n is the current time step, the input is x(n), the output is y(n), and a is a scaling factor between −1 and 1, then $$y(n)=ay(n-1)+x(n).$$

Hard limiting means that if $\{ay(n-1)+x(n)\}$ is greater than the limiting value L, then y(n) is set equal to L. If the quantity $\{ay(n-1)+x(n)\}$ is less than −L, y(n) is set equal to −L.

In any practical implementation, y(n) is a number that must fit within a finite number of bits, so hard limiting must be enforced. The leakiness of the integrator limits the length of time that past inputs can affect the integrator output.

In the Delta Phase Modulator, the leaky integrator estimates the average frequency offset of signal S1 as reflected in the sequence of values signal B takes.

Signal F from integrator 24 is delivered to a scaling block 25 which multiplies signal F by a constant to produce a signal F2. The signal F2 is supplied to one input of a summing block 26.

Step size adaptation block 22 produces an output signal F3 which represents a calculated change, having a particular step size, in the phase difference between S1 and C2. Signal F3 is supplied to a second input of summing block 26 and the sum output from block 26 is a signal F4 which represents an estimate of the change in the phase difference between signals S1 and C2 between the last sampling phase and the current sampling phase, i.e. between the arrival of the last segment of signal B and the current segment of signal B.

Signal F4 is supplied to an accumulator block 27, which adds the presently received value of signal F4 to previously accumulated values to produce the phase signal Ph.

The delta phase modulator runs from a single clock, in essence. The clock causes all memory cells in the block to latch their current inputs. The input for the delta modulator is provided by the lead/lag detector, which effectively latches the input for the delta phase modulator, so the delta modulator does not need to latch the input itself.

The delta phase modulator is a block in a discrete-time signal processing system. New input samples arrive at the input at a fixed rate. When a new sample arrives, the delta modulator begins processing, and produces a single output sample based on the current input sample, and previous input samples. After the delta modulator produces an output sample, it performs no other processing until it receives the next input sample.

The successive digital signals F3 produced by step size adaptation block 22 represent the magnitude of each step by which the multi-bit digital signal F2 is to be increased or decreased in order to produce the signal F4 representing the estimated phase difference, described above. The magnitude of a step is determined on the basis of an index which changes from one sampling cycle to the next by an amount which depends on whether the value of the most recently received segment of signal B was the same or opposite to the value of the immediately preceding segment of signal B. The index values are successive integers, starting from zero, while the step values (F3) are represented by hexadecimal digital values. Each step value (F3) is determined from a calculated index value with the aid of a lookup Table, one example of which is shown below.

| LOOKUP TABLE | |
|---|---|
| Index | Step (F3) |
| 0 | 00001h |
| 1 | 00001h |
| 2 | 00002h |
| 3 | 00003h |
| 4 | 00006h |
| 5 | 0000Ah |
| 6 | 00012h |
| 7 | 0001Fh |
| 8 | 00033h |
| 9 | 00055h |
| 10 | 0008Ch |
| 11 | 000E6h |
| 12 | 0017Bh |
| 13 | 0026Fh |
| 14 | 003FFh |
| 15 | 0068Fh |
| 16 | 00AC3h |
| 17 | 011A9h |
| 18 | 01CFAh |
| 19 | 02F8Ch |
| 20 | 04E03h |
| 21 | 07FFFh |
| 22 | 0D200h |
| 23 | 0FFFFh |

As can be seen from the above Lookup Table, the step values vary as a monotonic, increasing function of the index values.

Figure 5:
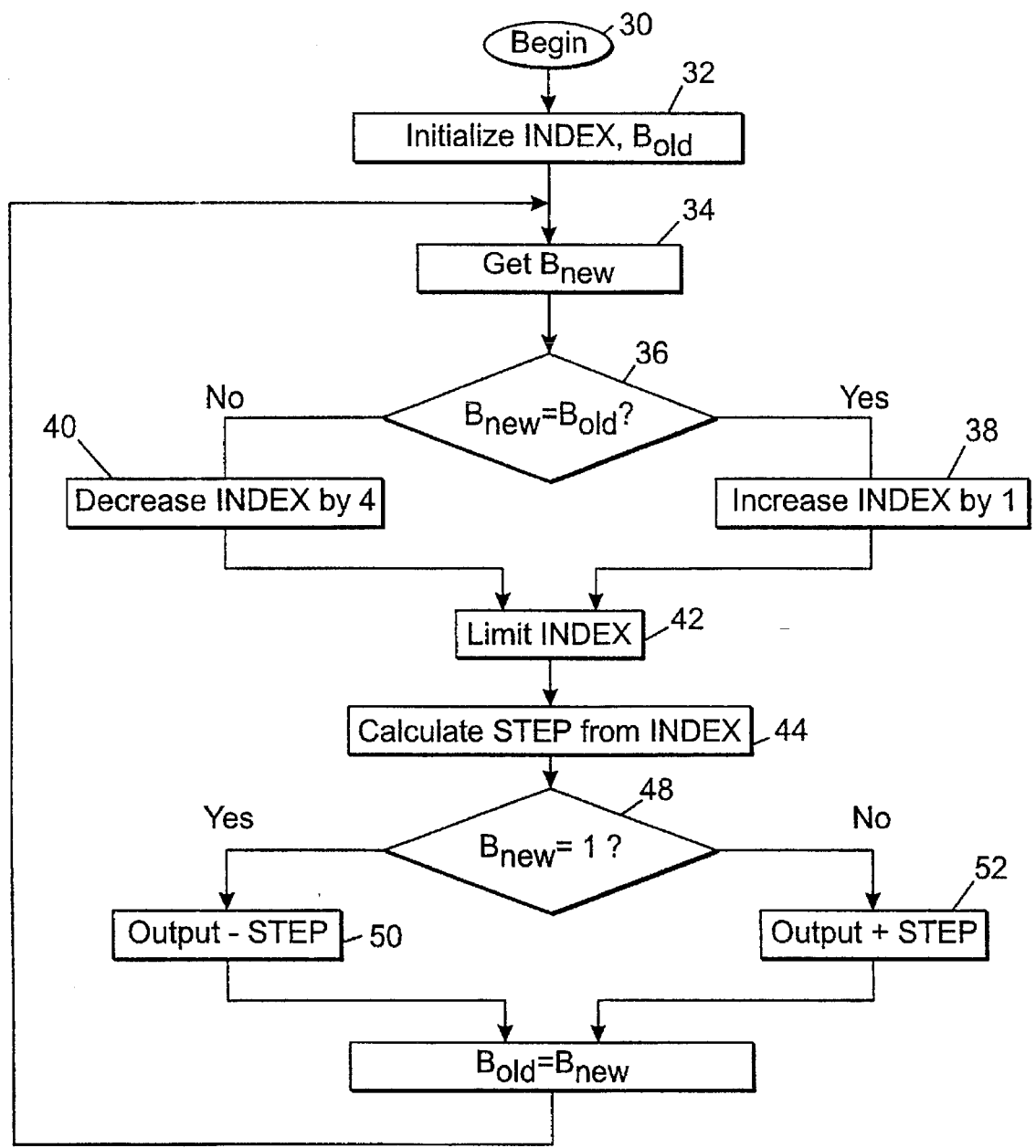
FIG. 5 a programming flow diagram illustrating a process for controlling step adaptation according to the invention.

One exemplary manner in which index values are calculated in step size adaptation block 22 is illustrated by a programming flow diagram in FIG. 5. At the start of operation of the phase detector, represented in FIG. 5 by block 30, initial values are set, in block 32, for the index and a segment of signal B ($B_{old}$). These values may be selected arbitrarily and may each initially have a value of zero.

Then, after the operation of the detector has commenced, the current value, $B_{new}$, of an arriving segment of signal B is determined, in block 34, and $B_{new}$ is compared with $B_{old}$ in decision block 36. If $B_{new}=B_{old}$, then, in block 38, the previous index is increased by 1. If, on the other hand, $B_{new} \neq B_{old}$, then the index is decreased by 4 in block 40. After the index has been either increased or decreased, the value of the index is limited to a predetermined value in block 42. The limiting is applied to prevent the index from exceeding the bounds of the lookup table. For example, if the block 42 calculation would produce a new INDEX value less than 0, the new INDEX value is 0. If the calculation would produce a new INDEX value greater than 23, then the new INDEX value is 23. INDEX is limited to keep it within the range of the lookup table. Then, the appropriate step value, signal F3, is calculated in block 44, based on a lookup table such as presented above.

After the value for F3 has been calculated, a determination is made, in decision block 48, as to whether the value of $B_{new}$ is representative of a condition in which signal C2 was leading or lagging signal S1. If C2 was leading S1, then $B_{new}$ had a value of 1 and the negative version of the step value is output as signal F3, as represented by block 50. If $B_{new}=0$, then a positive version of the step value is output, as represented by block 52, as signal F3. After outputting signal F3, the current value of $B_{new}$ replaces the previous value of $B_{old}$ in block 54, and operation returns to the input of block 34, where the next value of $B_{new}$ is detected.

Figure 6:
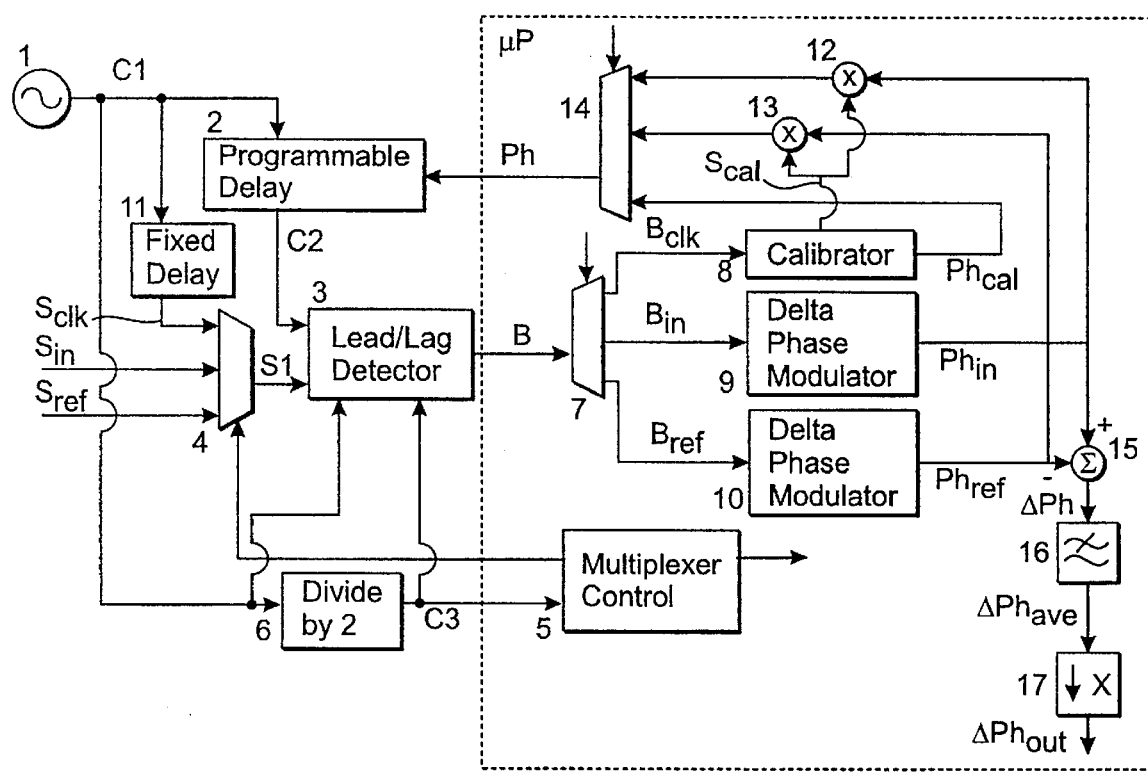
FIG. 6 is a block diagram of a further embodiment of a digital phase detector according to the invention.

A further embodiment of the invention, which is an enhanced version of the embodiment of FIG. 1, is shown in FIG. 6, where components identical to those of FIG. 1 are given the same reference numerals and signals identical to those of FIG. 1 are given the same identifying designations. A first time multiplexer 4 has a plurality of inputs connected to receive a plurality of input signals, including a signal $S_{in}$ from another unit (not shown) connected to the system, a reference signal $S_{ref}$, also from another unit (not shown) connected to the system, and a signal $S_{clk}$, obtained by passing clock signal C1 through a fixed delay device 11 which delays signal C1 by a fixed amount to produce a second delayed clock signal, $S_{clk}$.

$S_{in}$ and $S_{ref}$ must have the same nominal frequency. The purpose of the device shown in FIG. 6 is to determine the phase difference between $S_{in}$ and $S_{ref}$. The phase difference may change over time. The maximum rate of change of phase difference between $S_{in}$ and $S_{ref}$ is a function of the nominal frequency of $S_{in}$ and $S_{ref}$.

The signal C3 is supplied to an input of a multiplexer control 5 which is connected to control the operation of multiplexer 4. The control signal from multiplexer control 5 switches the connection of the output of multiplexer 4 from one input thereof to the next at the rate of signal C3, thereby ensuring generation by lead/lag detector 3 of a valid sample value B during each sampling period regardless of the phase relationship between C1 and the signal S1 currently being outputted from multiplexer 4. Each high-low transition, or trailing edge, of signal C3 produces a multiplex switching step in multiplexer 4. Therefore, each transfer of signal b from the D input to the Q output of flip-flop 19 occurs after two pulses of signal S1 from any source.

The output signal B from detector 3 is conducted to the input of a time demultiplexer 7. This input is selectively connected to successive ones of a plurality of outputs under control of a control signal from multiplexer control 5. Demultiplexer 7 has, in the illustrated embodiment, three outputs each supplying segments of the signal sample associated with a given input to multiplexer 4. These outputs are labelled:

$B_{clk}$, associated with $S_{clk}$;
$B_{in}$, associated with $S_{in}$; and
$B_{ref}$ associated with $S_{ref}$.

The signal segments $B_{clk}$ are delivered to the signal input of a calibrator 8, the signal segments $B_{in}$ are delivered to the signal input of first delta phase modulator 9, and the signal segments $B_{ref}$ are delivered to the input of a second delta phase modulator 10 which is identical to modulator 9.

Calibrator 8 produces an estimate of the relation between the actual delay being produced by programmable delay device 2 and a nominal delay, i.e. the delay produced by fixed delay device 11 on the basis of the segments $B_{clk}$. $B_{clk}$ is derived in detector 3 by comparing $S_{clk}$ with C2. Calibrator 8 produces a signal $S_{cal}$, which is used as a multiplication factor that corrects for variations in the range and resolution of delay device 2, and a signal $Ph_{cal}$ which represents the current phase difference between C2 and $S_{clk}$. The units of resolution of delay device 2 relative to its range may vary in dependence on temperature, power supply voltage, age, etc. An embodiment of calibrator 8 will be described in greater detail below.

Each delta phase modulator 9 and 10 receives a respective one of signals $B_{in}$ and $B_{ref}$. Each of these signals is a train of single bits, or segments, each bit having a binary 1 value if the associated segment of sample B was high and a binary 0 value if the associated segment of sample B was low. Each delta phase modulator 9, 10 produces an output signal, $Ph_{in}$ or $Ph_{ref}$, which is a multi-bit digital signal representing an estimate of the current phase of the corresponding clock, or periodic digital, signal, $S_{in}$ or $S_{ref}$ with respect to clock signal C1.

The output of each modulator 9, 10 is connected to one signal input of a respective multiplier 12, 13. The second input of each multiplier 12, 13 is connected to receive the signal $S_{cal}$ from calibrator 8. The output signal from each multiplier 12, 13 is supplied to a respective input of a further time multiplexer 14.

Calibrator 8 further produces a signal $Ph_{cal}$, which is a multi-bit signal representing the current phase difference between clock signal C1 and delayed clock signal $S_{clk}$ and delivers signal $Ph_{cal}$ to a further input of multiplexer 14.

Multiplexer 14 has an output connected to deliver multi-bit signal Ph to programmable delay device 2, which signal determines the magnitude of the delay to be produced by delay device 2.

Multiplexer 14 is controlled by multiplexer control 5 so that the signal supplied to delay device 2 represents the previously determined phase of the clock signal currently being conducted to detector 3.

The outputs of modulators 9 and 10 are further supplied to adding and subtracting inputs, respectively, of a summing junction 15. The difference signal, ΔPh produced by summing junction 15 represents the difference in phase between $Ph_{in}$ and $Ph_{ref}$ independent of the phase of clock signal C1.

The signal from summing junction 15 is conducted to a low pass filter 16 which limits the bandwidth of, and time averages, the signal ΔPh to produce a signal $ΔPh_{ave}$. That signal is conducted to a down sampler 17 which sub-samples the signal $ΔPh_{ave}$ and produces a signal $ΔPh_{out}$, which is a series of digital numbers representing the phase difference between $S_{in}$ and $S_{ref}$.

Figure 7:
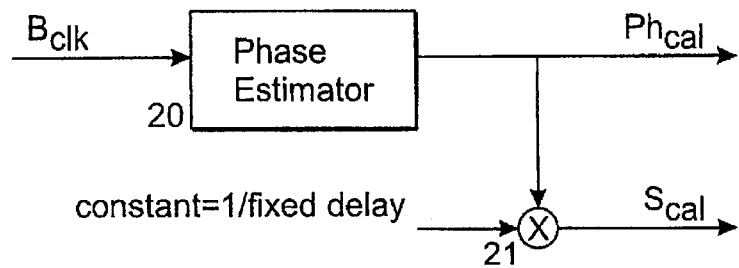
FIG. 7 is a block diagram of a calibrator employed in the detector of FIG. 6.

An embodiment of calibrator 8 is illustrated in FIG. 7. This embodiment is composed essentially of a phase estimator block 20 and a digital multiplier 21. Phase estimator block 20 receives the current bit segment of signal $B_{clk}$ and uses the value of this segment and the values of previously received segments to generate the signal $Ph_{cal}$ which is a multi-bit number representing the current phase difference between C1 and $S_{clk}$. Phase estimator block 20 may be constituted by a delta phase modulator, such as shown in FIG. 4, and the operation of which is depicted in FIG. 5, or may be implemented to perform a successive phase approximation, which will be described below.

In multiplier 21, the signal $Ph_{cal}$ is multiplied by a constant which is inversely proportional to the magnitude of the delay imparted by fixed delay device 11 to produce the signal $S_{cal}$, constituting the calibration constant.

In general, it is easier to control delay variation with temperature, aging, and power supply voltage, and component variation for a fixed delay line than a programmable delay line. Variation of delay for common implementations of programmable delay lines will often change the range, and finer resolution subintervals, by some fraction. Therefore for most implementations the delay through the high resolution programmable delay line (block 2) will experience more variation than the delay through the fixed delay line (block 11). By using the Programmable Delay line with the Calibrator (block 8) to measure the delay through the Fixed Delay line, we can derive a correction factor, $S_{cal}$, and multiply Programmable Delay line settings by that factor in order to correct for variations with respect to the Fixed Delay line.

For example, if the Fixed Delay is actually 100 nanoseconds, but the Calibrator calculates a delay of 105 nanoseconds for the Fixed Delay, then $$S_{cal} = 105/100.$$

In other words, we must take a fraction of $105/100$ of the calculated delay. This way, the calculated delay matches the nominal delay, but the error introduced by the Programmable Delay line is cancelled.

Figure 8:
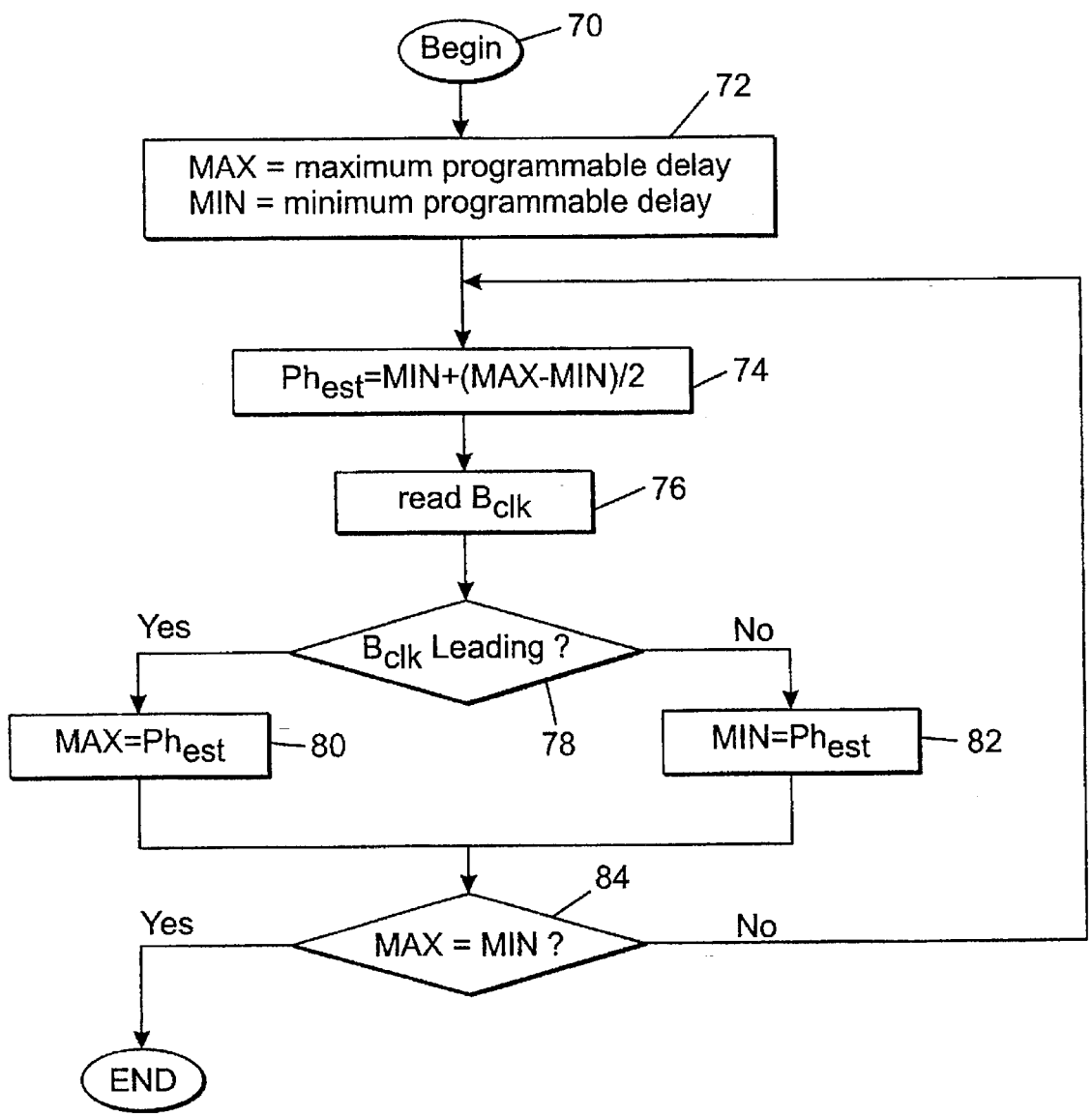
FIG. 8 a programming flow diagram illustrating a process for effecting successive phase approximation according to the invention.

An example of the implementation of phase estimator block 20 to produce an output on the basis of a successive phase approximation is illustrated by the programming flow diagram of FIG. 8. The operation depicted in FIG. 8 is based on a general binary search algorithm, such as disclosed in: A. V. Aho, J. E. Hopcroft, J. D. Ullman, *Data Structures and Algorithms*, Massachusetts, 1983, pp. 365–366.

In the procedure shown in FIG. 8, there first occurs, at the start of operation of the phase detector, represented by block 70, and initialization of two values, MAX and MIN, representing, respectively, the maximum and minimum programmable delays of delay device 2. This initialization is represented by block 72. Then, in block 74, a first estimated phase difference is calculated as one-half the difference between the values MAX and MIN.

Then, in block 76, the value of a segment of $B_{clk}$ is read. In decision block 78, a determination is made as to whether the value of the segment $B_{clk}$ which has been read indicates that C2 was leading or lagging $S_{clk}$. If the answer is yes, then, in block 80, the value of MAX is set to the calculated value of $Ph_{est}$. If the answer is no, then, in block 82, the value of MIN is set to the calculated value of $Ph_{est}$.

Then, the current values of MAX and MIN are compared in decision block 84. If they are equal, then $Ph_{est}$ is output as $Ph_{cal}$. If they are not equal, then operation then returns to block 74, and the new value for MAX or MIN is used in the subsequent operation.

Calibrator 8 produce outputs only after MAX=MIN.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A digital phase detector comprising:

input means providing a periodic digital signal having a repetition rate;

a source of a digital local clock signal having a repetition rate equal to that of the input signal;

digitally controllable signal delay means having a signal input, a signal output and a control input, said delay means being operative for conducting a signal present at said signal input to said signal output with a time delay having a duration determined by a control signal supplied to said control input, said signal input being connected to receive one of the periodic digital signal and the digital local clock signal;

a phase relation detector connected to receive a first input signal from said signal output of said signal delay means and a second input signal which comprises the one of the periodic digital signal and the digital local clock signal which is not received by said signal input of said signal delay means, for periodically comparing the phases of the first and second input signals and for producing a binary output signal composed of a succession of signal segments, each segment having a first value when the first input signal is leading the second input signal in phase and a second value when the first input signal is lagging the second input signal in phase; and digital modulator means having an input connected to said phase relation detector for receiving the binary output signal from said phase relation detector and producing a first multi-bit digital output signal representative of the magnitude of the phase difference between the periodic digital signal and the digital local clock signal based on the values of successive signal segments of the binary output signal produced by said phase relation detector, wherein said digital modulator means comprise: a one-bit quantizer connected to said modulator means input for receiving the binary output signal from said phase relation detector and for producing a quantized signal having a first polarity in response to each binary output signal segment having the first value and having a second polarity in response to each binary signal segment having the second value; digital signal generating means connected to receive the quantized signal produced by said quantizer for producing a first digital signal having a value based on the polarities of the quantized signals associated with the values of a succession of binary output signal segments; step signal generating means connected to said modulator means input for receiving the binary output signal from said phase relation detector and for producing a second digital signal having a value which varies in response to each binary signal segment being received as a function of the relation between the values of the binary signal segment being received and the immediately preceding binary signal segment; and summing means connected for receiving and summing the first digital signal and the second digital signal to produce the first multi-bit digital output signal of said digital modulator means.

2. A detector as defined in claim 1 wherein said signal input of said digitally controllable signal delay means is connected to receive the digital local clock signal.

3. A digital phase detector comprising:

input means providing a periodic digital signal having a repetition rate;

a source of a digital local clock signal having a repetition rate equal to that of the input signal;

digitally controllable signal delay means having a signal input, a signal output and a control input, said delay means being operative for conducting a signal present at said signal input to said signal output with a time delay having a duration determined by a control signal supplied to said control input, said signal input being connected to receive one of the periodic digital signal and the digital local clock signal;

a phase relation detector connected to receive a first input signal from said signal output of said signal delay means and a second input signal which comprises the one of the periodic digital signal and the digital local clock signal which is not received by said signal input of said signal delay means, for periodically comparing the phases of the first and second input signals and for producing a binary output signal composed of a succession of signal segments, each segment having a first value when the first input signal is leading the second input signal in phase and a second value when the first input signal is lagging the second input signal in phase; and digital modulator means having an input connected to said phase relation detector for receiving the binary output signal from said phase relation detector and producing a first multi-bit digital output signal representative of the magnitude of the phase difference between the periodic digital signal and the digital local clock signal based on the values of successive signal segments of the binary output signal produced by said phase relation detector, wherein said phase relation detector is operative for producing the succession of signal segments at a repetition rate which is one-half the repetition rate of the periodic digital signal.

4. A detector as defined in claim 1 wherein said digital signal generating means comprise integrator means connected to receive the quantized signal produced by said quantizer for producing a first digital signal having a value proportional to the time integral of the quantized signal.

5. A detector as defined in claim 1 wherein said step signal generating means are operative for varying the second digital signal value by a first amount when the binary signal segment being received has the same value as the immediately preceding binary signal segment and by a second amount when the binary signal segment being received has a different value than the immediately preceding binary signal segment, and the first amount is smaller than the second amount.

6. A digital phase detector comprising:

input means providing a periodic digital signal having a repetition rate;

a source of a digital local clock signal having a repetition rate equal to that of the input signal;

digitally controllable signal delay means having a signal input, a signal output and a control input, said delay means being operative for conducting a signal present at said signal input to said signal output with a time delay having a duration determined by a control signal supplied to said control input, said signal input being connected to receive one of the periodic digital signal and the digital local clock signal;

a phase relation detector connected to receive a first input signal from said signal output of said signal delay means and a second input signal which comprises the one of the periodic digital signal and the digital local clock signal which is not received by said signal input of said signal delay means, for periodically comparing the phases of the first and second input signals and for producing a binary output signal composed of a succession of signal segments, each segment having a first value when the first input signal is leading the second input signal in phase and a second value when the first input signal is lagging the second input signal in phase; and digital modulator means having an input connected to said phase relation detector for receiving the binary output signal from said phase relation detector and producing a first multi-bit digital output signal representative of the magnitude of the phase difference between the periodic digital signal and the digital local clock signal based on the values of successive signal segments of the binary output signal produced by said phase relation detector, wherein the signal input of said digitally controllable signal delay means is connected to receive the digital local clock signal, and said detector further comprises:

fixed time delay means connected to said digital local clock signal source for producing a delayed digital local clock signal having a fixed delay relative to the digital local clock signal from said source;

first time multiplexer means connected to said phase relation detector for periodically delivering the delayed digital clock signal to said phase relation detector in alternation with the periodic digital signal, wherein the second input signal comprises portions of the periodic digital signal; time demultiplexer means having an input connected to said phase relation detector for receiving the binary output signal produced by said phase relation detector, said time demultiplexer means having a first output and a second output and being operative for conducting signal segments resulting from comparison of the phases of the first input signal and the periodic digital signal to said first output, and for conducting signal segments resulting from comparison of the phases of the first input signal and the delayed digital clock signal to said second output, wherein said time demultiplexer means are connected between said phase relation detector and said digital demodulator means, and said first output of said time demultiplexer means is connected to said input of said digital modulator means;

calibrator means having an input connected to said second output of said time demultiplexer means for receiving the signal segments conducted to said second output and producing a second multi-bit digital output signal representative of the magnitude of the phase difference between the delayed digital clock signal and the digital local clock signal based on the values of successive signal segments of the binary signal produced by said phase relation detector and conducted to said second output of said time demultiplexer means; and second time multiplexer means having a first input connected to receive the first multi-bit digital output signal, a second input connected to receive the second multi-bit digital output signal and an output connected to said control input of said digitally controllable signal delay means, said second time multiplexer means being operative for conducting portions of said first and second multi-bit digital signals in alternation to said control input of said digitally controllable signal delay means.

* * * * *